United States Patent
Lepper et al.

(10) Patent No.: US 12,214,690 B2
(45) Date of Patent: Feb. 4, 2025

(54) ELECTRIC METER

(71) Applicant: Isabellenhuette Heusler GmbH & Co. KG, Dillenburg (DE)

(72) Inventors: Andreas Lepper, Hohenahr (DE); Michael Pollmann, Dillenburg (DE)

(73) Assignee: ISABELLENHUETTE HEUSLER GMBH & CO. KG, Dillenburg (DE)

( * ) Notice: Subject to any disclaimer, the term of this patent is extended or adjusted under 35 U.S.C. 154(b) by 859 days.

(21) Appl. No.: 17/285,655

(22) PCT Filed: Sep. 16, 2019

(86) PCT No.: PCT/EP2019/074671
§ 371 (c)(1),
(2) Date: Apr. 15, 2021

(87) PCT Pub. No.: WO2020/078633
PCT Pub. Date: Apr. 23, 2020

(65) Prior Publication Data
US 2021/0394638 A1 Dec. 23, 2021

(30) Foreign Application Priority Data
Oct. 16, 2018 (DE) .......................... 102018125598.5

(51) Int. Cl.
*B60L 53/62* (2019.01)
*B60L 53/66* (2019.01)
(Continued)

(52) U.S. Cl.
CPC .............. *B60L 53/66* (2019.02); *B60L 53/62* (2019.02); *G01R 22/061* (2013.01); *B60L 53/18* (2019.02)

(58) Field of Classification Search
CPC .. H02J 50/12; H02J 50/90; H02J 50/70; H02J 50/60; H02J 50/80; H02J 50/50;
(Continued)

(56) References Cited

U.S. PATENT DOCUMENTS

| 6,014,021 A | 1/2000 | Le Van Suu |
| 8,860,368 B2 | 10/2014 | Ohtomo |

(Continued)

FOREIGN PATENT DOCUMENTS

| AU | 2010264383 B2 | 12/2010 |
| CN | 104682520 A | 6/2015 |

(Continued)

OTHER PUBLICATIONS

English abstract of FR2987449A1.
(Continued)

*Primary Examiner* — Binh C Tat
(74) *Attorney, Agent, or Firm* — Caesar Rivise, PC

(57) ABSTRACT

The invention relates to an electric meter (1) for measuring the electric consumption of an electric load ($R_{LOAD}$), in particular while charging an electric vehicle. The electric meter according to the invention has a current measuring device (11) in order to measure a charging current ($I_{LOAD}$) which flows through a charging cable (7) to a transfer point (9, 10) for the load ($R_{LOAD}$), wherein the transfer point (9, 10) is preferably located in a plug (8) of the charging cable (7). Furthermore, the electric meter (1) according to the invention includes a voltage measuring device (12) for measuring a voltage. According to the invention, the voltage measuring device (12) measures the voltage directly at the transfer point (9, 10) of the charging cable (7) in order to determine line losses in the charging cable (7), in particular in order to take into consideration the line losses when calculating the consumption.

14 Claims, 3 Drawing Sheets

(51) Int. Cl.
*G01R 22/06* (2006.01)
*B60L 53/18* (2019.01)

(58) Field of Classification Search
CPC ........ H02J 7/0047; H02J 7/00304; H02J 7/35;
H02J 7/00034; H02J 2300/28; H02J
7/00309; H02J 7/34; H02J 50/005; H02J
7/00045; H02J 50/10; H02J 50/402; H02J
50/502; H02J 50/05; H02J 7/0029; H02J
2310/48; H02J 50/40; H02J 7/00; H02J
2310/40; H02J 3/322; H02J 13/00004;
H02J 2310/14; H02J 3/0075; H02J 3/06;
H02J 3/32; H02J 50/20; H02J 50/30;
H02J 9/06; H02J 9/062; H02J 1/10; H02J
3/14; H02J 3/38; H02J 50/15; H02J
2207/40; H02J 2310/23; H02J 50/23;
B60R 16/03; H01M 2220/20; B60L
53/126; B60L 53/64; B60L 2240/72;
B60L 53/14; B60L 53/18
USPC .................................................. 320/106–115
See application file for complete search history.

(56) References Cited

U.S. PATENT DOCUMENTS

| | | | |
|---|---|---|---|
| 2010/0174667 A1 | 7/2010 | Vitale et al. | |
| 2011/0285350 A1 | 11/2011 | Mitsutani | |
| 2013/0127414 A1 | 5/2013 | Ohtomo | |
| 2014/0253102 A1* | 9/2014 | Wood | G01R 21/133 |
| | | | 324/140 R |
| 2014/0354266 A1* | 12/2014 | Hurwitz | G01R 19/0092 |
| | | | 324/140 R |
| 2015/0108966 A1* | 4/2015 | Kadonoff | G01R 19/0092 |
| | | | 324/127 |
| 2015/0346288 A1 | 12/2015 | Hardy et al. | |

FOREIGN PATENT DOCUMENTS

| | | |
|---|---|---|
| CN | 205185893 U | 4/2016 |
| CN | 105699816 A | 6/2016 |
| CN | 106569145 A | 4/2017 |
| DE | 102012110525 A1 | 5/2013 |
| EP | 0787994 A1 | 8/1997 |
| FR | 2947055 A1 | 12/2010 |
| FR | 2987449 A1 | 8/2013 |
| JP | 2001028844 A | 1/2001 |
| KR | 20160051363 A | 5/2016 |
| KR | 20160096350 A | 8/2016 |
| WO | WO2018/186529 A1 | 10/2018 |

OTHER PUBLICATIONS

English abstract of WO2018/186529A1.
Stoychev et al., "A Measurement System for Electric Car Charging Stations Utilising a FPGA Board for Flexibility in Configuration", 2016 IEEE International Symposium on Circuits and Systems, pp. 630-633, May 22, 2016.
Winkle et al., "Electric Vehicle Charging Stations in Magdeburg", IEEE, Vehicle Power and Propulsion Conference 2009, pp. 60-65, Sep. 7, 20019.
International Search Report for corresponding PCT Application No. PCT/EP2019/074671 dated Dec. 11, 2019.

* cited by examiner

ELECTRIC METER

CROSS-REFERENCE TO RELATED APPLICATIONS

This application is a U.S. National Phase Application under 35 U.S.C. § 371 of PCT/EP2019/074671, filed Sep. 16, 2019, which claims priority to German Patent application Ser. No. 10/201,8125598.5, filed Oct. 16, 2018, the contents of which are incorporated herein by reference in their entirety.

BACKGROUND OF THE INVENTION

The invention relates to an electric meter for measuring the electrical consumption of an electrical load (e.g. electric car). Furthermore, the invention includes a charging cable adapted accordingly.

Electric meters are known from the state of the art, which are used, for example, during a charging process of an electric car in order to measure the electrical power taken during a charging process, which is necessary for consumption billing. FIG. 1 shows a schematic representation of such a known electric meter 1, which is connected on the input side via a high-side current connection 2 and a low-side current connection 3 to a charging source 4, which is only shown schematically here. On the output side, the electric meter also has a high-side current connection 5 and a low-side current connection 6, whereby the high-side current connection 5 and the low-side current connection 6 is connected to an electrical load $R_{LOAD}$ via a charging cable 7 with a plug 8. The plug 8 has two connections 9, 10, which define a transfer point to the $R_{LOAD}$ load. The charging cable 7 has a charging line $R_{CABLE,HIGH}$ on the high side and a charging line $R_{CABLE,LOW}$ on the low side. During a charging process a charging current $I_{LOAD}$ flows through the charging cable 7 to the load $R_{LOAD}$, for example to charge a rechargeable battery in an electric car. The charging current $I_{LOAD}$ is measured in the electric meter 1 by a current measuring device 11, whereby the current measuring device 11 can measure the charging current $I_{LOAD}$, for example, by means of a low-ohmic current measuring resistance ("shunt"). Furthermore, the electric meter 1 includes a voltage measuring device 12, which measures an output voltage $U_{OUT}$ between high-side and low-side within the electric meter 1. An evaluation unit 13 then calculates the charge power $P_{LOAD}$ from the measured charge current $IL_{OAD}$ and the measured output voltage $U_{ouT}$, which can be used for consumption billing.

The problem with this well-known measuring principle is that the line losses in the charging cable 7 are not taken into account, so that the actual charging power at the transfer point formed by the two connections 9, 10 of the plug 8 is smaller than the charging power $P_{LOAD}$ calculated by the evaluation unit 13.

A further problem of this well-known measuring principle is that the quality of the electrical contact at the high-side current connection 5 and at the low-side current connection 6 cannot be checked.

Furthermore it is also possible that the resistance of the two charging lines $R_{CABLE,HIGH}$, $R_{CABLE,LOW}$ deterio-rates over time during operation, which also cannot be detected.

The invention is therefore based on the task of creating a correspondingly improved electric meter and a corresponding charging cable.

SUMMARY

This task is solved by an electric meter in accordance with the invention and a correspondingly adapted charging cable in accordance with the independent claims.

The invention is initially based on the technical-physical realization that the line resistances in the charging cable and the contact resistances at the output of the electric meter are problematic in operation, as already explained above. The invention therefore comprises the general technical teaching that the voltage measuring device in the electric meter measures the electrical voltage directly at the transfer point of the charging cable, i.e. usually in the detachable plug, in order to be able to take the line losses into account.

On the one hand, this enables an exact calculation of consumption, since the customer is not charged for the line losses in the charging cable.

On the other hand, the voltage measurement at the transfer point also enables an assessment of the quality of the electrical contact between the electric meter and the charging cable as well as a detection of a change in the line resistance in the charging cable over time.

The electric meter according to the invention first of all has a current measuring device in accordance with the known electric meter described above in order to measure the charging current which flows via a charging cable to a transfer point for the load, whereby the transfer point is preferably located in a plug of the charging cable.

In a preferred embodiment of the invention, the current is measured by the current measuring device by means of a low-impedance current measuring resistor ("shunt") according to the known four-wire technique. Here, the charging current is conducted through the low ohmic current measuring resistor and the voltage across the current measuring resistor is measured, which according to the ohmic law forms a measure for the charging current.

However, the invention is not limited to shunt based current measurement with respect to the measuring principle of the current measuring device. Rather, the current measuring device can in principle also use other measuring principles for current measurement.

In addition, the electric meter according to the invention comprises a voltage measuring device for voltage measurement as in the prior art. The electric meter according to the invention differs from the known electric meter described at the beginning in that the voltage measuring device measures the voltage not or not only inside the electric meter, but directly at the transfer point to the load, so that line losses in the charging cable can be taken into account. This voltage measurement directly at the transfer point is preferably carried out by means of measuring lines which start in the charging cable from the transfer point and are led to the electric meter, which is why the invention also includes an appropriately adapted charging cable, as described in detail below.

In the preferred embodiment of the invention, the electric meter has two current connections on the input side to connect the electric meter to a charging source. In addition, the electric meter preferably also has two current connections on the output side in order to be able to connect the electric meter to the load via a charging cable. The charging current is thus generated by the charging source and flows through the electric meter to the load and back again.

In addition, the electric meter preferably has a first voltage measurement input and a second voltage measurement input to measure the voltage directly at the transfer point to the load. Furthermore, the voltage measuring device according to the invention preferably has a third voltage measuring input to measure a voltage at the input-side second current connection against a reference potential. The reference potential is preferably the same for all voltage measurement inputs and is preferably formed by the output-side first current connection.

For example, the voltage measurement inputs can each be connected to the reference potential via a voltage divider, whereby such voltage dividers for voltage measurement are known from the state of the art and therefore need not be described in detail.

Furthermore, the electric meter according to the invention preferably includes an evaluation unit for determining the line losses occurring in the charging cable depending on the voltage measurement per-formed by the voltage measuring device. Alternatively or in addition, the evaluation unit can also calculate other operating variables, such as the following operating variables:

The charging voltage dropping at the transfer point,
the voltage drop across the first charging line of the charging cable,
the voltage drop across the second charging line of the charging cable,
the line losses in the charging cable,
the line resistance of the first charging line of the charging cable,
the line resistance of the second charging line of the charging cable.

In addition, the invention provides the possibility of a plausibility check of the measured values for the charging voltage. The voltage measuring device can measure the charging voltage directly at the transfer point to the load. The evaluation unit can then calculate a second measured value for the charging voltage, which does not take into account the line losses in the charging cable and is calculated, for example, from the third voltage and the reference limit potential. The evaluation unit can then compare the two measured values of the charging voltage and, depending on the comparison, output an error signal, for example to signal a line break in the charging cable or poor contact quality between the electric meter and the charging cable.

A similar evaluation can also be made with regard to the line resistances in the charging cable. Thus, the various voltage measurements described above also allow the calculation of the line resistance of the charging cable. The evaluation unit can then check whether the line resistance of the charging cable is within a given tolerance field and output an error signal if the calculated line resistance is outside the tolerance field. In addition, the quality of the contact between the electric meter and the transfer point can also be checked in this way, i.e. the evaluation unit can output a control signal indicating whether the charging cable is correctly connected to the electric meter.

In the preferred embodiment of the invention, the input-side second current connection is conductively connected to the output-side second current connection or combined in a single current connection. The first current connection on the input side is then preferably connected to the first current connection on the output side via the low-resistance current measuring resistor or generally via the current measuring device.

Basically, the principle according to the invention is suitable for both direct current measurement and alternating current measurement. In the preferred embodiment of the invention, however, the electric meter is suitable for direct current measurement and is designed accordingly. The first current connection on the input side is then a high-side current connection, which receives the charging current at the high-side from the charging source. The second current connection on the input side is then a low-side current connection, which feeds the charging current at the low-side back to the charging source. On the output side of the electric meter, the first current connection on the output side is then a high-side current connection, which delivers the charging current at the high-side to the load. The second current connection on the output side is then a low-side current connection, which receives the charging current at the low-side from the load. The first voltage measurement input is then a high-side voltage measurement input to measure the electrical potential at the transfer point to the load at the high-side. The second voltage measurement input, on the other hand, is a low-side voltage measurement input in a direct current measurement, measuring the electrical potential at the transfer point to the load on the low-side. The charging cable then has a high-side line and a low-side line.

It has already been briefly mentioned above that the invention also includes an appropriately adapted charging cable. The charging cable according to the invention is characterized by the fact that two measuring lines for voltage measurement are led to the transfer point in the plug so that the electric meter can measure the voltage at the transfer point via the measuring lines in the charging cable.

In the preferred embodiment of the invention, the charging cable has a continuous current-carrying capacity of at least 1 A, 2 A, 5 A, 10 A, 20 A, 50 A, 65 A, 100 A, 125 A, 200 A, 350 A, 500 A, 1250 A or 2000 A with respect to the charging current. With regard to the charging voltage, the charging cable preferably has an proof voltage of at least 50V, 100V, 200V, 300V, 600V, 750V, 1000V or 1500V.

It should also be mentioned that the term "charging cable" used in the context of the invention is not limited to charging cables in the strict sense of the word, which are used for charging a rechargeable battery, for example for connecting a charging station to an electric car. Rather, the term "charging cable" is to be understood in a general sense and also includes, for example, connecting cables between an electric meter and an electrical load.

Finally, it should be mentioned that the invention also claims protection for a complete charging system for recharging a load with a charging source, a charging cable and an electric meter arranged in between.

BRIEF DESCRIPTION OF THE DRAWINGS

Other advantageous further developments of the invention are indicated in the dependent claims or are further explained below together with the description of the preferred embodiment of the invention by means of the figures. They show:

DETAILED DESCRIPTION

Figure 1:
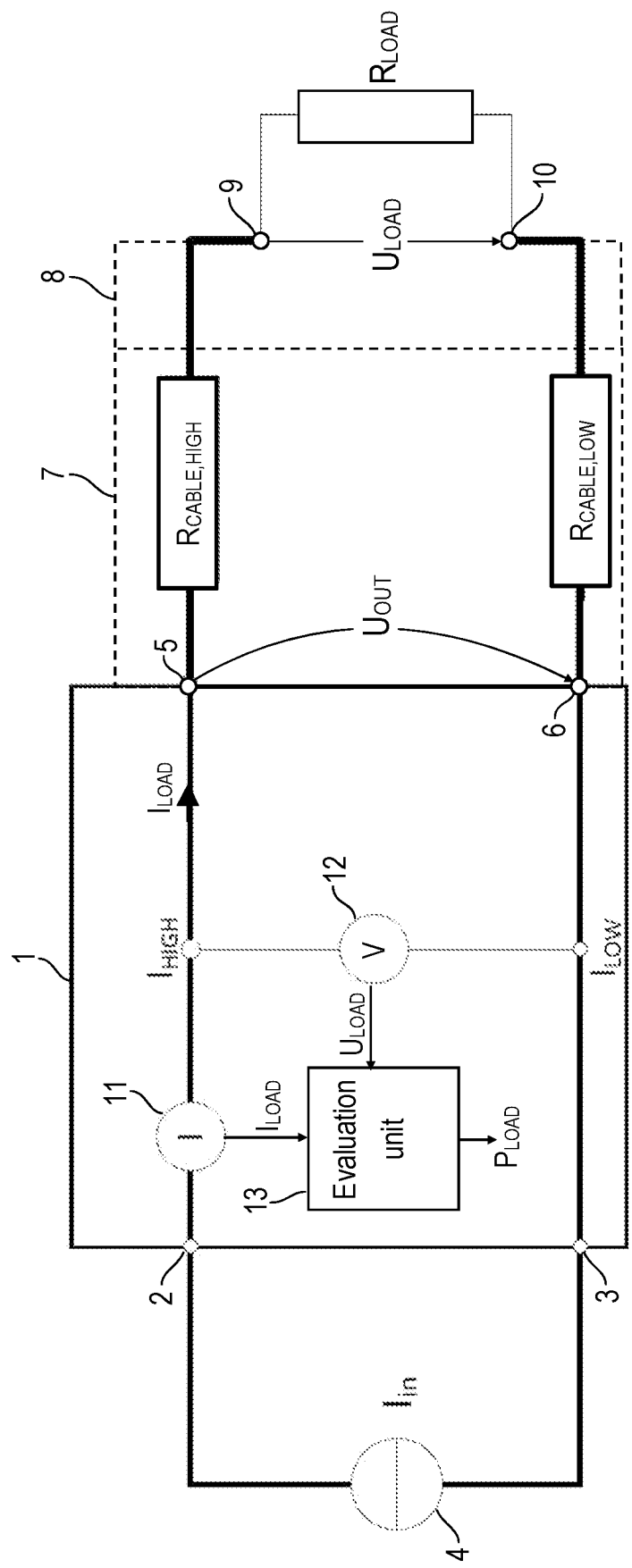
FIG. 1 a schematic representation of a conventional charging system with a charging source, a conventional electric meter, a charging cable with a plug and a load, FIG. 2 a schematic representation of the electric meter according to the invention in a charging system, as well as FIG. 3 is a flow chart to illustrate the operating mode of the electric meter according to the invention.
Figure 2:
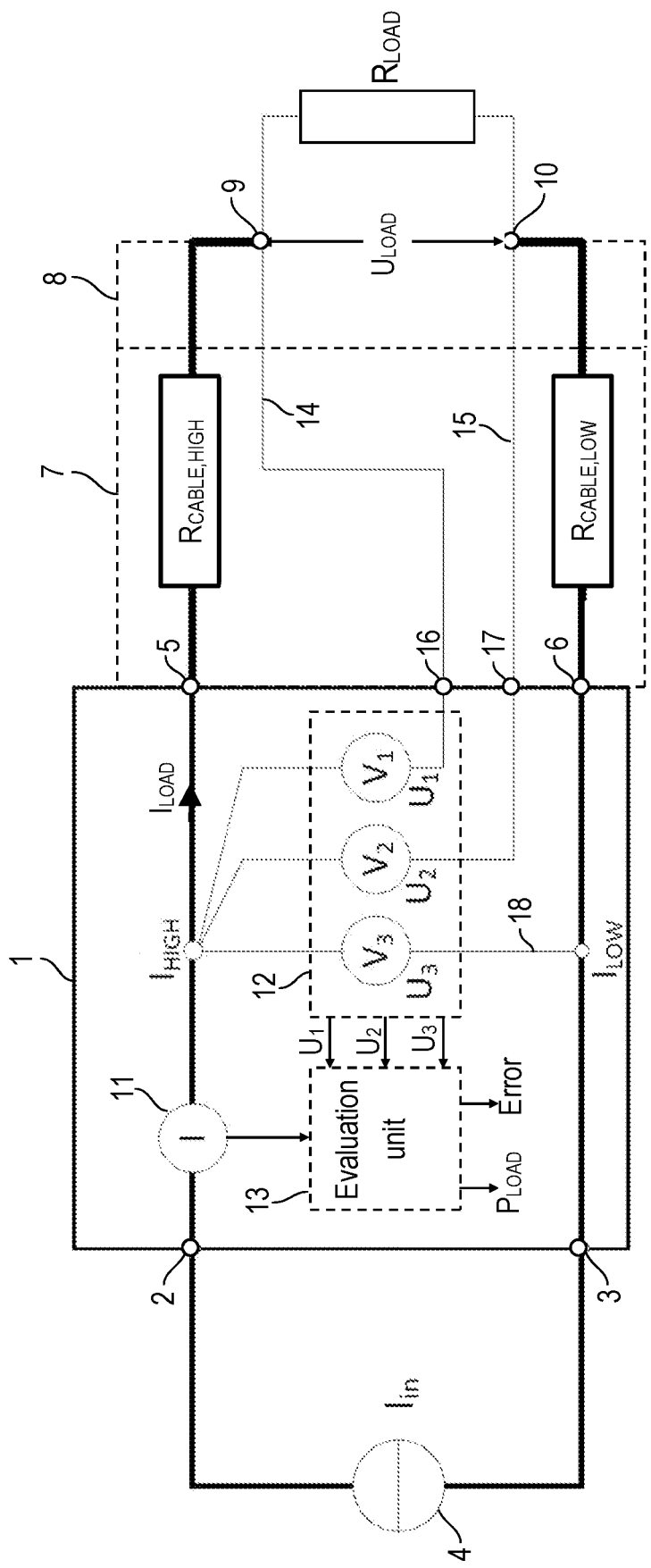

In the following, the embodiment according to FIG. 2 is described, which partly corresponds to the conventional system described at the beginning and shown in FIG. 1, so that in order to avoid repeti-tion, reference is made to the above description, whereby the same reference signs are used for corresponding details.

A special feature is that two measuring lines 14, 15 run through the charging cable 7, enabling voltage measurement directly at the transfer point formed by the two connections 9, 10 of the plug 8. The measuring line 14 enables a voltage measurement at the high-side at the connection 9 of the plug 8, while the other measuring line 15 enables a voltage measurement at the connection 10 of the plug 8 at the low-side.

Alternatively, however, it is also possible for the measuring lines 14, 15 to run outside the charging cable 7, for example in a separate measuring cable.

The electric meter 1 has two voltage measuring connections 16, 17 for the monitoring of the two measuring lines 14, 15.

Figure 3:
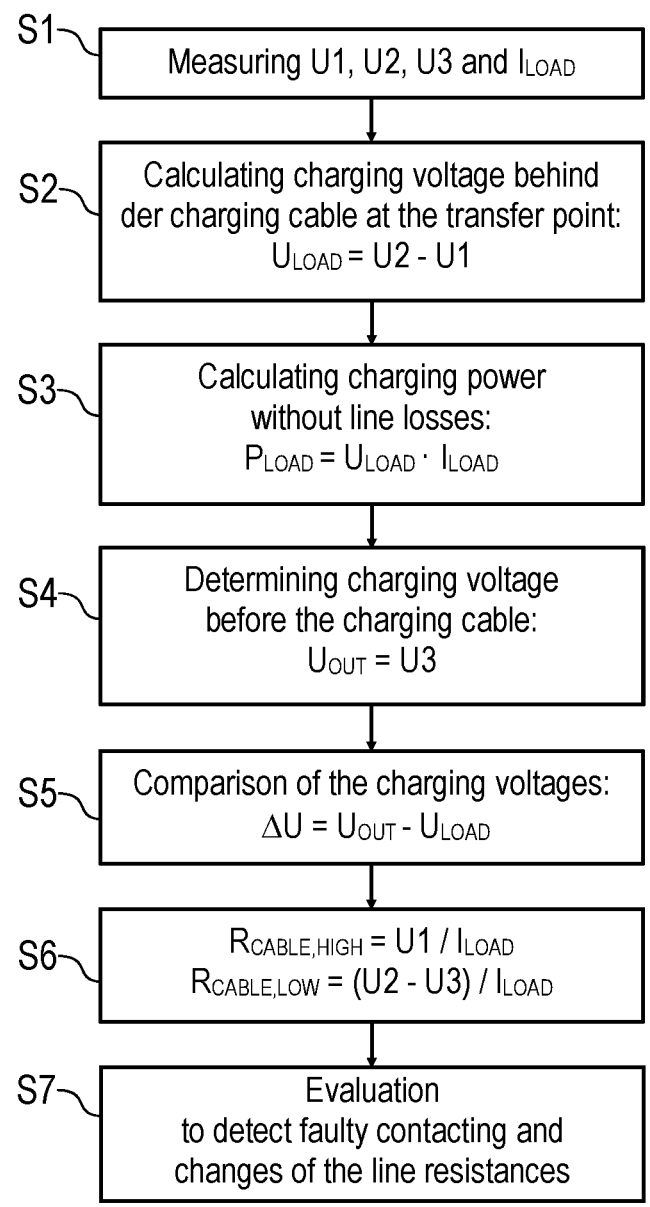

The voltage measuring device 12 includes two voltage measuring devices V1, V2, where the voltage measuring device V1 measures a voltage U1 at the connector 9 of the plug 8 on the high-side with respect to a reference potential formed by the high-side at the current connection 5 (step S1 in FIG. 3).

In addition, the voltage measuring device 12 has a voltage measuring device V2 which measures a voltage U2 on the other connector 10 of the plug 8 on the low side, also with respect to the reference potential on the current connection 5 on the high side of counter 1 (step S1 in FIG. 3).

In addition, the voltage measuring device 12 has a third voltage measuring device V3 that measures a voltage U3 between the high-side and low-side in the electric meter 1 via a measuring line 18 (step S1 in FIG. 3).

The three voltages U1, U2, U3 are transmitted to the evaluation unit 13.

Firstly, the evaluation unit 13 calculates the actual charging voltage $U_{LOAD}$ at the transfer point to the load $R_{LOAD}$ according to the following formula (step S2 in FIG. 3):

$$U_{LOAD} = U2 - U1$$

On the other hand, the evaluation unit 13 calculates the actual charging power $P_{LOAD}$ at the transfer point in the plug 8, which is formed by the two connectors 9, 10 of the plug 8, using the following formula (step S3 in FIG. 3):

$$P_{LOAD} = I_{LOAD} \cdot U_{LOAD} = I_{LOAD} \cdot (U2 - U1).$$

Furthermore, the evaluation unit 13 determines the charging voltage $U_{OUT}$ before the charging cable 7 as follows (step S4 in FIG. 3)

$$U_{OUT} = U3.$$

The evaluation unit 13 then calculates the difference between the two charging voltages $U_{OUT}$ before the charging cable 7 and $U_{LOAD}$ behind the charging cable 7 (step S5 in FIG. 3).

$$\Delta U = U_{OUT} - U_{LOAD}.$$

The voltage difference $\Delta U$ allows to detect whether the measuring lines 14, 15 are connected.

Furthermore, the evaluation unit 13 also calculates the line resistances $R_{CABLE,HIGH}$, $R_{CABLE,LOW}$ in the charging cable 7, whereby the line resistances $R_{CABLE,HIGH}$, $R_{CABLE,LOW}$ also include the contacting resistances between the electric meter 1 and the charging cable 7.

The calculation of the line resistances $R_{CABLE,HIGH}$, $R_{CABLE,LOW}$ is made according to the following formulas (step S6 in FIG. 3):

$$R_{CABLE,HIGH} = U1/I_{LOAD}$$

$$R_{CABLE,LOW} = (U2 - U3)/I_{LOAD}$$

Depending on the calculated line resistances $R_{CABLE,HIGH}$, $R_{CABLE,LOW}$ and the voltage difference $\Delta U$, the evaluation unit 13 can then output a control signal which indicates whether the plug 8 is properly plugged in and establishes a correct electrical connection to the load $R_{LOAD}$.

On the other hand, the evaluation unit 13 can check whether the value of the line resistances $R_{CABLE,HIGH}$, $R_{CABLE,LOW}$ changes slowly during operation, so that an error signal can be output if necessary.

The invention is not limited to the preferred embodiment described above. Rather, a large number of variants and modifications are possible, which also make use of the inventive idea and therefore fall within the scope of protection. In particular, the invention also claims protection for the subject-matter of the dependent claims independently of the claims referred to in each case and in particular also without the features of the independent claims. The invention thus comprises various aspects of the invention which enjoy protection independently of one another.

LIST OF REFERENCE SIGNS

1 Electric meter
2 Input-side high-side current connection
3 Input-side low-side current connection
4 Charging source
5 Output-side high-side current connection
6 Output-side low-side current connection
7 Charging cable
8 Plug
9, 10 Connectors of the plug
11 Current measuring device
12 Voltage measuring device
13 Evaluation unit
14, 15 Test lines in charging cable
16, 17 Voltage measuring device connections
18 Measuring line in the electric meter
$I_{Load}$ Charging current
$I_{in}$ Input current from the charging source
$P_{LOAD}$ Loading power
$R_{CABLE,HIGH}$ Line resistance in the charging cable on the high-side
$R_{CABLE,LOW}$ Line resistance in the charging cable on the low side
$R_{LOAD}$ Load
U1, U2, U3 Measured voltage values
$U_{LOAD}$ Charge voltage at the transfer point
$U_{OUT}$ Output voltage at the electric meter before the charging cable
V1, V2, V3 Voltage measuring device

The invention claimed is:

1. Electric meter for electrical consumption measurement at an electrical load, comprising:
   a) a current measuring device for measuring a charging current which flows via a charging cable to a transfer point for the load, the transfer point being located in a plug of the charging cable,
   b) a voltage measuring device for voltage measurement,
   c) a first current connection on the input side for receiving the charging current from a charging source,
   d) a second current connection on the input side to return the charging current to the charging source,
   e) a first current connection on the output side for conducting the charging current via the charging cable to the transfer point at the load, f) a second current connection on the output side to return the charging current from the load via the charging cable, and wherein the voltage measuring device is adapted to measure the voltage directly at the transfer point of the charging cable in order to determine line losses in the charging cable, the voltage measuring device has a first voltage measuring input for measuring a first voltage directly at the transfer point to the load with respect to a reference potential, the voltage measuring device has a second voltage measuring input for measuring a second voltage directly at the transfer point to the load with respect to the reference potential, and the voltage measuring device has a third voltage measuring input for measuring a third voltage at the input-side second current connection relative to the reference potential.

2. Electric meter according to claim 1, wherein
a) the first voltage measuring input is connected to the reference potential via a first voltage divider,
b) the second voltage measuring input is connected to the reference potential via a second voltage divider, and
c) the third voltage measuring input on the input side is connected to the reference potential via a third voltage divider.

3. Electric meter according to claim 2, wherein the reference potential is formed by the output-side first current connection.

4. Electric meter according to claim 1, further comprising an evaluation unit adapted for determining the line losses occurring in the charging cable in dependence on the voltage measurement by the voltage measuring device.

5. Electric meter according to claim 4, wherein the evaluation unit is adapted to calculate the charging voltage dropping directly at the transfer point from the first voltage and the second voltage.

6. Electric meter according to claim 4, wherein the evaluation unit is adapted to calculate the voltage drop across a first charging line of the charging cable from the second voltage relative to the reference potential.

7. Electric meter according to claim 4, wherein the evaluation unit is adapted to calculate the voltage drop across a second charging line of the charging cable from the third voltage and the first voltage.

8. Electric meter according to claim 4, wherein the evaluation unit is adapted to calculate the line losses in the charging cable from the following measured values:
a) the first voltage,
b) the second voltage,
c) the third voltage, and
d) the charging current.

9. Electric meter according to claim 4, wherein the evaluation unit is adapted to calculate the line resistance of the first charging line of the charging cable as a function of the charging current and the first voltage.

10. Electric meter according to claim 4, wherein the evaluation unit is adapted to calculate the line resistance of the second charging line of the charging cable as a function of the charging current and the first voltage and the second voltage.

11. Electric meter according to claim 1, wherein
a) the second current connection on the input side is conductively connected to the second current connection on the output side or is combined in a single current connection, and
b) the first current connection on the input side is connected to the first current connection on the output side via the low-impedance current measuring resistor.

12. Electric meter according to claim 1, wherein
a) the electric meter is a direct current meter,
b) the first current connection on the input side is a high-side current connection which receives the charging current at the high-side from the charging source,
c) the second current connection on the input side is a low-side current connection which returns the charging current at the low-side to the charging source,
d) the output-side first current connection is a high-side current connection which outputs the charging current at the high-side to the load,
e) the output-side second current connection is a low-side current connection which takes up the charging current at the low-side from the load,
f) the first voltage measuring input is a high-side voltage measuring input,
g) the second voltage measuring input is a low-side voltage measuring input,
h) the first charging line of the charging cable is a high-side line, and
i) the second charging line of the charging cable is a low-side line.

13. Charging system for charging a load, comprising:
a) a charging source for supplying a charging current for charging the load,
b) a charging cable including a plug for detachably connecting a charging source to a load and for forming a transfer point to the load, a first charging line for conducting a charging current to the load, a second charging line to return the charging current from the load, a first measuring line for measuring the charging voltage directly at the transfer point in the plug, the first measuring line extending along the charging cable to the transfer point in the plug, and a second measuring line for measuring the charging voltage directly at the transfer point in the plug, the second measuring line extending along the charging cable to the transfer point in the plug, and
c) an electric meter according to claim 1, wherein the electric meter is connected on one side to the charging source and on the other side to the charging cable.

14. Electric meter for electrical consumption measurement at an electrical load, comprising:
a) a current measuring device for measuring a charging current which flows via a charging cable to a transfer point for the load, the transfer point being located in a plug of the charging cable,
b) a voltage measuring device for voltage measurement,
c) an evaluation unit adapted for determining the line losses occurring in the charging cable in dependence on the voltage measurement by the voltage measuring device, wherein
d) the voltage measuring device is adapted to measure the voltage directly at the transfer point of the charging cable in order to determine line losses in the charging cable,
e) the evaluation unit is adapted to calculate the charging voltage dropping directly at the transfer point from the first voltage and the second voltage,
f) the evaluation unit is adapted to calculate a first measured value of the charging voltage from the reference potential and the third voltage, the first measured value not taking into account any line losses in the charging cable, g) the evaluation unit is adapted to calculate a second measured value of the charging voltage from the first voltage at the transfer point and the second voltage at the transfer point, the second measured value taking into account the line losses in the charging cable, and
h) the evaluation unit is adapted to compare the two measured values of the charging voltage with one another and, depending on the comparison, to output an error signal to signal a line break in the charging cable or a poor contact quality between the electric meter and the transfer point.

* * * * *